United States Patent [19]

Pinkhasov

[11] Patent Number: 4,548,670
[45] Date of Patent: Oct. 22, 1985

[54] SILICON MELTING AND EVAPORATION METHOD FOR HIGH PURITY APPLICATIONS

[75] Inventor: Eduard Pinkhasov, Mt. Vernon, N.Y.
[73] Assignee: Wedtech Corp., Bronx, N.Y.
[21] Appl. No.: 633,124
[22] Filed: Jul. 20, 1984
[51] Int. Cl.[4] .............................................. C22B 4/00
[52] U.S. Cl. ........................... 156/617 SP; 23/293 R; 75/10 R; 156/610; 156/617 M; 373/61; 373/62; 373/63; 427/248.1
[58] Field of Search ............... 156/617 SP; 23/293 R; 75/10 R; 156/610, 617 M, 617 SP; 373/61–63; 427/248.1

Primary Examiner—Bernard D. Pianalto
Attorney, Agent, or Firm—Karl F. Ross; Herbert Dubno

[57] ABSTRACT

A high-purity method of forming a silicon melt utilizes a solid silicon body which is drilled to provide bores into which electrodes are inserted. The electrodes preferably are also of silicon and an electric arc-current is passed through the electrodes to generate an arc which melts out the body to define a cavity therein containing the melt. The melt may be used for the drawing of a silicon bar or for the deposition of silicon in vapor form from the melt upon a substrate in a vacuum chamber.

12 Claims, 4 Drawing Figures

SILICON MELTING AND EVAPORATION METHOD FOR HIGH PURITY APPLICATIONS

CROSS REFERENCE TO RELATED APPLICATIONS

The present application is related to the commonly assigned copending patent application Ser. No. 618,192 filed 7 June 1984 by me and entitled METHOD OF AND APPARATUS FOR THE DRAWING OF BARS OF MONOCRYSTALLINE SILICON.

FIELD OF THE INVENTION

The present invention is drawn to the melting of elemental silicon, i.e. the formation of a silicon melt and to the use of the melt, e.g. in the drawing of high-purity bars of silicon which can be then cut up to produce silicon wafers or for the vaporization of silicon, e.g. to deposit silicon or a compound thereof upon a substrate.

BACKGROUND OF THE INVENTION

In the afore-mentioned copending application I have pointed out that monocrystalline wafers are of considerable significance in the production of semiconductive circuit elements in electronic technology. The production of such silicon wafers generally involves the lowering of a high-purity monocrystalline silicon seed into a melt of elemental silicon contained in a quartz crucible or vessel which must, because of its sensitivity to the temperature at which the melt must be held, generally be supported in a graphite or carbon outer vessel.

Various techniques are utilized in the generation of bars and the process may be carried out under a controlled atmosphere or vacuum to minimize the contamination of the melt. That application also points out that the quartz crucible tends to soften or contribute contaminants to the melts, that contaminants may enter the melt as a result of transfer from the supporting vessel, and that the stability of the silicon may be adversely affected by the inductive methods used to generate the heat forming the melt.

It is there also pointed out that deformation and deterioration of the crucible can be detected in part by coating the crucible as described in the commonly assigned copending application Ser. No. 614,434 filed 25 May 1984 and entitled METHOD OF COATING CERAMICS AND QUARTZ CRUCIBLES WITH MATERIAL ELECTRICALLY TRANSFORMED INTO A VAPOR PHASE.

That application is a continuation-in-part of my application Ser. No. 494,302 filed May 13, 1983 as a continuation-in-part of Ser. No. 358,186 filed March 15, 1982 (U.S. Pat. No. 4,438,183), in turn a continuation-in-part of Ser. No. 237,670 filed Feb. 24, 1981 (U.S. Pat. No. 4,351,855) incorporating subject matter of disclosure document Nos. 078,337, 078,334 and 078,329, all of Feb. 26, 1979, and disclosure document No. 082,283 of July 5, 1979.

The earlier application dealing with the quartz crucibles describes the formation of silicon carbide and silicon nitride in the vapor phase in situ upon the vaporization of elemental silicon and the coating of the quartz crucible with silicon and these compounds.

Application Ser. No. 618,192 recognizes that some of the problems remain in spite of the coating because of the softening action of the quartz crucible.

Consequently, Ser. No. 618,192 provides a unique approach to eliminating contamination of the melt and the silicon which is produced therefrom, utilizing the discovery that silicon granules or powder (generally: particles) have a relatively low conductivity, both thermal and electrically, and thus it is possible to effect an electric melting in a mass of such particles of the silicon by generating an electric arc within this mass and thereby allow the remainder of the mass to form an insulating layer between the crucible and the melt which is thereby produced.

For especially high purity production of silicon melts, however, this method may not be fully satisfactory since there is always a possibility of migration of contaminants through the interstices of the porous mass, the contamination of the surfaces of the particles, or the transfer of contaminants to the melt via the insulating layer.

OBJECTS OF THE INVENTION

It is, therefore, the principal object of the present invention to provide an improved method of generating a silicon melt for any purpose for which the formation of such a melt may be desired without the drawbacks outlined above.

Another object of the invention is to provide a method of making especially high-purity silicon bars from which silicon wafers can be cut.

It is also an object of this invention to provide a method of making high-purity silicon coatings.

It is a further object of this invention to provide a method for the melting of silicon which extends the principles set forth in the earlier applications mentioned.

SUMMARY OF THE INVENTION

I have now discovered that it is possible to provide a completely crucible free generation of a silicon melt utilizing the unique properties of elemental silicon by forming a block of elemental silicon as a monocrystalline or polycrystalline mass and providing within the interior of this block a pair of electrodes across which an arc is struck so that as the electric current is passed through these electrodes and the arc, the body is melted from the interior outwardly to generate the aforementioned melt which can be utilized for the drawing of monocrystalline bars, for the production of silicon wafers for coating purposes or, if desired, for the casting of the elemental silicon in an especially high purity stage because of the fact that the solid block of silicon in which the melt is produced is practically impermeable to impurities and does not allow impurities to penetrate at the cavity containing the melt which is formed in situ within the block.

The invention is based upon my discovery that, in spite of the fact that electrodes can be fitted in holes drilled in the unitary block of silicon, an electric current can nevertheless be passed through the electrode and across the gap between them to generate the arc since the electrode can be of greater electrical conductivity than the surrounding block of the silicon. Indeed, when the electrodes themselves are comprised of silicon and are separated from the solid block of silicon solely by an interface formed by inserting them in bores of the silicon block, the preferential current flow will be through the electrode and across the gap with only a minimum dispersion of the electric current through the adjoining portions of the block. It is indeed surprising that electric current and power dissipation through paths through the block are insufficient to prevent the melting operation described.

I have found that it is possible to enhance the current flow along the electrodes by heating them and/or by cooling this surrounding block. Apparently electrical conductivity and thermal conductivity across the aforementioned interface is significantly less than along the electrodes and within the block so that the heating of the electrodes to increase the electrical conductivity thereof and the cooling of the exterior of the block to decrease its electrical conductivity will suffice to ensure the local generation of heat in the region of the electrode. Once the incipient melt is formed, the melting or dissolving of adjoining areas of the body can proceed more easily and, of course, when the electrodes are comprised of silicon, contaminants are not introduced through these electrodes.

In addition, since the electrodes tend to melt away substantially at the same rate as the wall of the cavity, it may be desirable to periodically, continuously or intermittently advance the electrodes so that the gap between them may be less than the width of the cavity.

The electric current can be controlled to effect melting without vapor generation, or can be increased to vaporize the silicon and allow coating of a substrate.

For example, a current of 70 amperes may be used for melting to allow the drawing of a silicon bar from the melt while, with the same structure, the current can be increased to, say, 120 amperes to effect vaporizing of silicon.

According to the invention, moreover, an arc-striking electrode can be fed toward one of the other electrodes and indeed brought into contact therewith to strike the arc and can then be withdrawn or left in place to be melted with or without precipitating any further arc generation.

BRIEF DESCRIPTION OF THE INVENTION

The above and other objects, features and advantages of the present invention will become more readily apparent from the following description, reference being made to the accompanying drawing in which.

SPECIFIC DESCRIPTION

Figure 1:
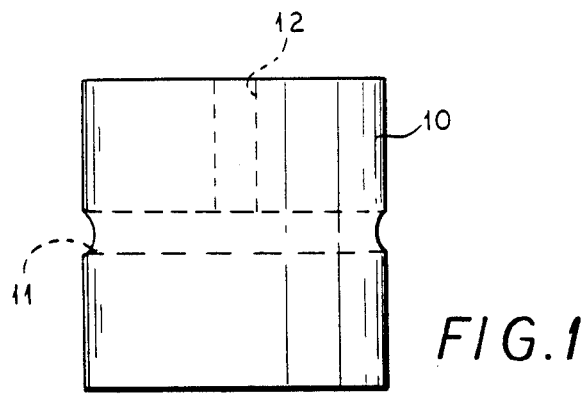
FIG. 1 is an elevational view of a silicon block which is used for the melting of silicon in accordance with the present invention.

A silicon body as shown at 10 in FIG. 1 comprises bores 11 and 12 into which respective electrodes can be inserted. The body 10 can be made by casting molten silicon in a mold of appropriate shape, whereupon the bores 11 and 12 are drilled.

Figure 2:
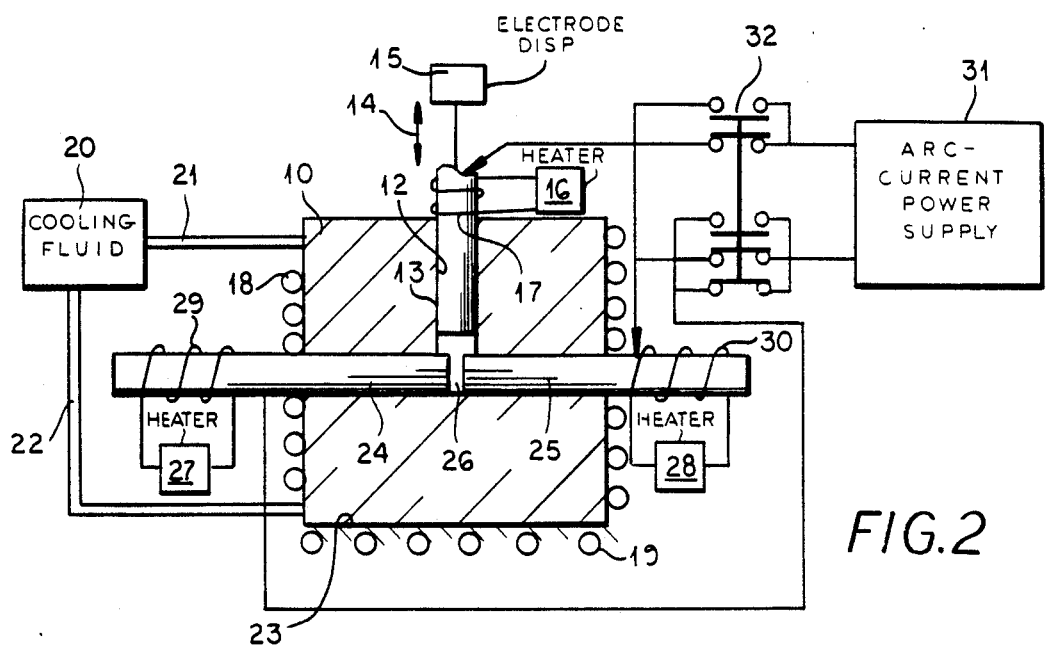
FIG. 2 is a cross-sectional view in highly diagrammatic form of a melting apparatus prior to the commencement of the melting operation.

The apparatus shown in FIG. 2 can comprise a table or support 23 for the body 10 into a bore 12 of which an arcstriking electrode 13 is passed, the arc-striking electrode being movable upwardly and downwardly as represented by the arrow 14 and an electrode displacing member 15. A heater 16 has its coil 17 surrounding the electrode 13 so that the temperature of the latter is above that of the block and hence its conductivity is greater than that of the block.

The body 10 can be closely surrounded by a cooling coil 18 which can be connected at turns of a cooling coil 19 in the support 23, the cooling coils 18 and 19 being supplied by a circulating cooling fluid by a coolant recirculator 20 to ensure that the temperature of the body is less than that of the electrode. The pipes 21 and 22 are connected to the cooling coil.

The arc-striking electrode 13 cooperates with a pair of arc-maintaining electrodes 24 and 25 defining a gap 26 between them.

The electrodes 24 and 25 are heated, in turn, by respective heating units 27 and 28 with the respective coils 29 and 30 surrounding the electrodes. The heating units can be units capable of circulating a heating fluid or passing an electric current thrugh resistive heating coils surrounding the electrodes.

An arc-current supply 31 can be connected to the electrodes via a switching device shown diagrammatically at 32. The switching device 32 is connected so that in one position (the position shown), the electrodes 24 and 25 are connected to one terminal of the arc-current source 31, which can be a direct current source, while the other terminal of the latter is connected to the electrode 13.

Using the member 15, the electrode 13 can be approached at the electrodes 24 and 25 to be contacted therewith so that an arc is provided as the electrode 13 is withdrawn after the arc has stabilized. The switch 32 can be operated to apply the arc current through the electrodes 24 and 25, whereupon the electrode 13 can be withdrawn or left in place in the event restarting is required.

Figure 3:
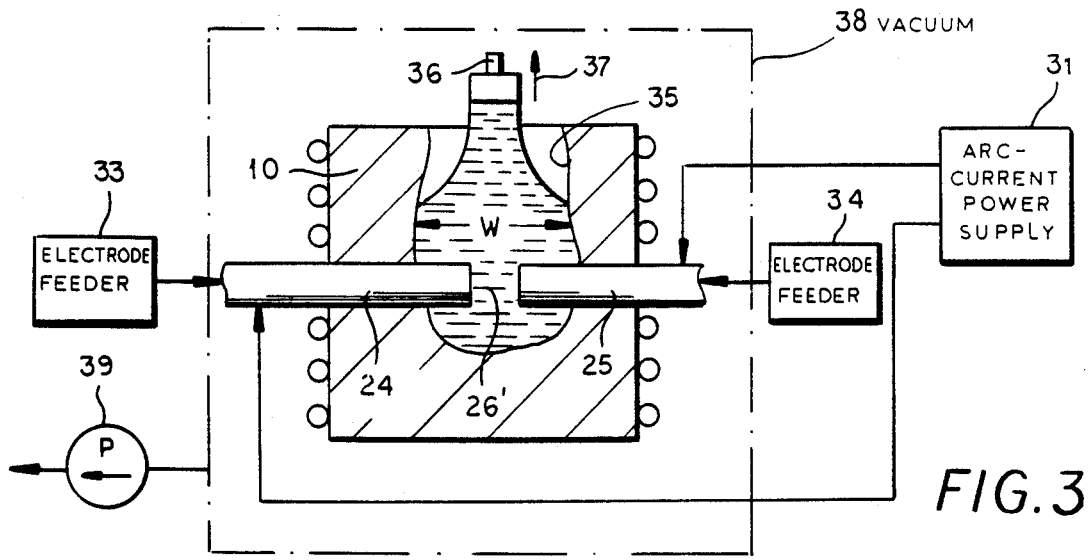
FIG. 3 is a cross-sectional view, likewise in diagrammatic form showing only a part of the apparatus of FIG. 2 as this apparatus is utilized for the drawing of a silicon bar from the melt.

As can be seen from FIG. 3, the electrodes 24 and 25 can be provided with electrode feeders 33 and 34 which can maintain a gap 26' which is smaller than the width W of the cavity 35 melting in the block 60.

From the melt, a silicon bar can be withdrawn as discussed in application Ser. No. 618,192 by a seed which has been lowered into the melt on a rod 36 which can then be drawn upwardly as represented by the arrow 37. The rod and the body 10 can be counterrotated as described in the last-mentioned application and the process can be carried out in a vacuum chamber 38 provided with a suction pump 39.

Figure 4:
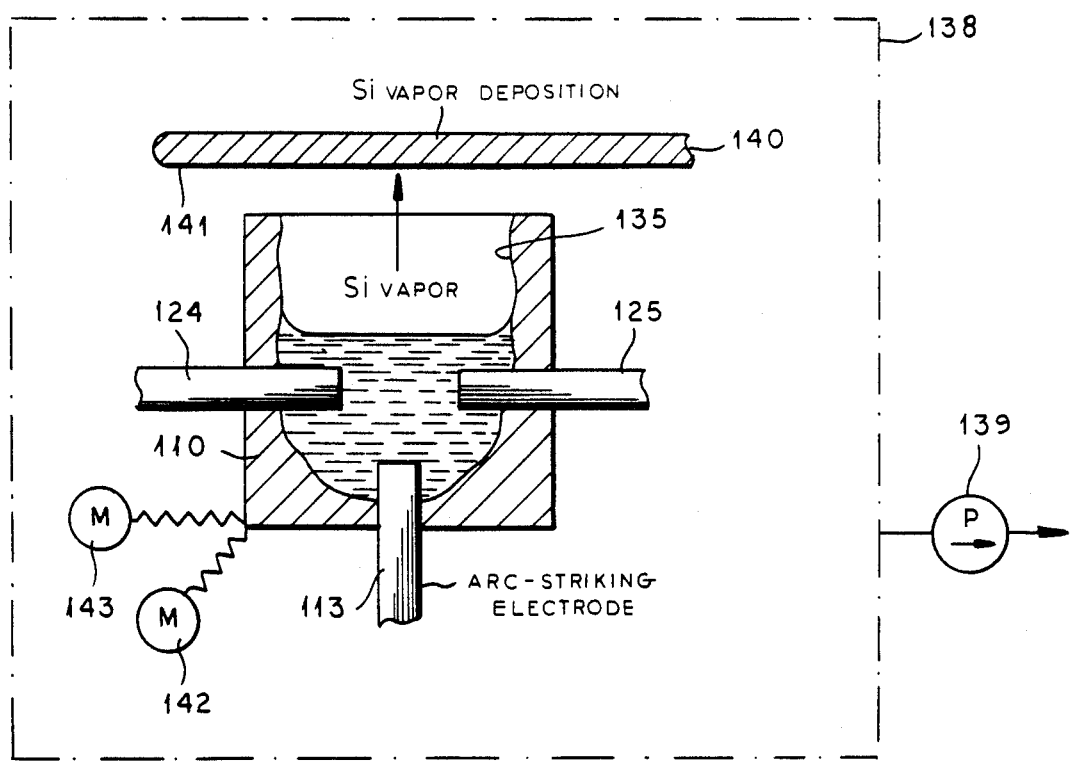
FIG. 4 is a view similar to FIG. 3 but of an apparatus for the deposition of a silicon coating on a surface.

In the embodiment of FIG. 4 the vacuum chamber 138 is evacuated by the pump 139 and receives a substrate represented by a plate 140 whose surface 141 is coated with silicon vapor from an upwardly moving vessel formed by the body 110 of silicon and which surrounds the cavity 135 from which the silicon vapor rises to contact the substrate. The body 110 can be moved along the X and Y coordinate axes by members 142 and 143 to ensure complete conversion of the surface 141 and the arc is maintained between a pair of electrodes 124 and 125 in the manner described, the electrode 113 being drawn downwardly after its use in striking the arc. In neither case need a crucible be used and in both embodiments it is possible to provide a container for holding the block 110, although this container was a container for the melt directly on a source of contaminants.

SPECIFIC EXAMPLE

A cylindrical block as shown in FIG. 1 is radially drilled to form a throughgoing hole extending along a diameter of the silicon block and a pair of electrode rods are inserted and brought into contact therein. The electrode rods are also composed of silicon. An arc current of about 80 amperes is passed through the rods which are drawn apart to strike the arc which is maintained at a voltage of 80 to 100 V and at a current of 80 to 100 amperes as the surrounding silicon block melts. When the melt reaches the surface, the current is increased to about 120 amperes and vaporization of the silicon melt occurs at this surface and is used to coat a substrate. The melt is also used as a source of molten silicon for the drawing of a silicon bar therefrom as described in application Ser. No. 618,192. The silicon block is cooled at about 0° C. at its surface while the electrodes are heated so that they are at a temperature of about 300° C. just as they enter the silicon bed.

I claim:

1. A method of melting silicon which comprises the steps of:
   (a) forming at least one bore in a solid silicon body and juxtaposing a pair of electrodes including at least one electrode extending into said bore, within the interior of said body; and
   (b) passing an electric current through said electrodes for generating an electric arc between phase ends of said electrodes in the interior of said body to melt silicon from said body and form a cavity therein containing molten silicon.

2. The method defined in claim 1, further comprising the step of cooling said body during the generation of said electric arc within the interior thereof.

3. The method defined in claim 1, further comprising the step of heating said electrodes independently of said electric arc during the passing of said electric current through said electrodes.

4. The method defined in claim 1 wherein said electrodes are formed from silicon.

5. A method of producing a silicon bar which comprises the steps of:
   (a) forming a silicon melt by:
      ($a_1$) forming at least one bore in a solid silicon body and juxtaposing a pair of electrodes including at least one electrode extending into said bore, within the interior of said body;
      ($a_2$) passing an electric current through said electrodes for generating an electric arc between phase ends of said electrodes in the interior of said body to melt silicon from said body and form a cavity therein containing molten silicon; and
      ($a_3$) continuing the melting of said body by maintaining the electric arc until said cavity opens at said surface to afford access to said melt; and
   (b) drawing a column of molten silicon from said melt and cooling same to produce a bar.

6. The method defined in claim 5, further comprising the step of cooling said body during the generation of said electric arc within the interior thereof.

7. The method defined in claim 5, further comprising the step of heating said electrodes independently of said electric arc during the passing of said electric current through said electrodes.

8. The method defined in claim 5 wherein said electrodes are formed from silicon.

9. A method of coating a substrate with silicon which comprises the step of:
   (a) forming a silicon melt by:
      ($a_1$) forming at least one bore in a solid silicon body and juxtaposing a pair of electrodes including at least one electrode extending into said bore, within the interior of said body;
      ($a_2$) passing an electric current through said electrodes for generating an electric arc between phase ends of said electrodes in the interior of said body to melt silicon from said body and form a cavity therein containing molten silicon;
      ($a_3$) continuing the melting of said body by maintaining the electric arc until said cavity opens at said surface to afford access to said melt; and
      ($a_4$) controlling said electric current to vaporize silicon melt from said cavity;
   (b) juxtaposing a substrate with said body so that silicon vapors contact said substrate and silicon deposits therein; and
   (c) evacuating a space surrounding said body and said substrate and traversed by silicon vapors.

10. The method defined in claim 9, further comprising the step of cooling said body during the generation of said electric arc within the interior thereof.

11. The method defined in claim 9, further comprising the step of heating said electrodes independently of said electric arc during the passing of said electric current through said electrodes.

12. The method defined in claim 9 wherein said electrodes are formed from silicon.

* * * * *